(12) United States Patent
Nakayama

(10) Patent No.: US 7,439,846 B2
(45) Date of Patent: Oct. 21, 2008

(54) RESISTANCE ADJUSTING METHOD AND RESISTANCE ADJUSTING ELEMENT AND RESISTANCE ADJUSTING DEVICE

(75) Inventor: Kouichi Nakayama, Kasama (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 11/834,815

(22) Filed: Aug. 7, 2007

(65) Prior Publication Data

US 2008/0048824 A1 Feb. 28, 2008

(30) Foreign Application Priority Data

Aug. 25, 2006 (JP) ............................. 2006-228542

(51) Int. Cl.
*H01C 10/00* (2006.01)

(52) U.S. Cl. ................... 338/195; 338/306; 219/121.69

(58) Field of Classification Search ................ 338/195, 338/206, 293, 295, 279, 280, 320, 306, 308; 219/121.68, 121.69
See application file for complete search history.

(56) References Cited

U.S. PATENT DOCUMENTS

| | | | | |
|---|---|---|---|---|
| 5,198,794 A | * | 3/1993 | Sato et al. | .................... 338/195 |
| 5,258,738 A | * | 11/1993 | Schat | ......................... 338/332 |
| 6,184,775 B1 | * | 2/2001 | Gerber et al. | ................ 338/195 |
| 6,462,304 B2 | * | 10/2002 | Kaida et al. | ............. 219/121.69 |

FOREIGN PATENT DOCUMENTS

JP      9-45515 A      2/1997

* cited by examiner

*Primary Examiner*—K. Richard Lee
(74) *Attorney, Agent, or Firm*—Crowell & Moring LLP

(57) ABSTRACT

A resistance adjusting method, a resistance adjusting element, and a resistance adjusting device are disclosed. The method includes first, second, and third cut-off steps that leave a part having a length capable of preventing cracking of a remaining resistance film. The resistance adjusting element includes first, second, and third cut-off parts. The resistance adjusting device includes a carrier portion, a laser irradiating portion, a drive portion, an image recognition portion, and a final resistance adjustment portion.

20 Claims, 5 Drawing Sheets

RESISTANCE ADJUSTING METHOD AND RESISTANCE ADJUSTING ELEMENT AND RESISTANCE ADJUSTING DEVICE

FIELD OF THE INVENTION

The present invention relates to a resistance adjusting method, a resistance adjusting element and a resistance adjusting device.

DESCRIPTION OF THE RELATED ART

Conventionally, a chip-like resistors has been used as a circuit element formed on an electronic circuit board. It is necessary to adjust a value of resistance of each chip-like resistor in order to adjust output characteristics of the electronic circuit board as a whole after mounting the resistor on the electronic circuit board. Such a chip-like resistor which is so called as a resistor film has been obtained by cutting off a part of calcined resistance such as a carbon paste with the use of a laser beam or the like so as to have a desired resistance value.

There has been in general known an adjustment of a resistance value by cutting off a resistance film, for example, as disclosed in JP-A-9-45515, in such a way that a preliminary adjustment is carried out for a resistance of the circuit board as a whole, and then, resistance adjustments are carried out at several positions on the circuit board in order that a final resistance adjustment can be carried out during an output adjustment after combination with the other equipments such as sensors and the like.

When a resistance film is cut off several times, there may be caused such a trouble that a current varies or no current runs by cracking or the like, in dependence upon a position of a cut-off part at a previous cutting off step and a position of a cut-off part at the subsequent cutting off step. Thus, in JP-A-9-45515, a position of a cut-off part which has been cut away at the last step is recognized, and then, a subsequent part is to be cut away. However, it is indeed difficult to recognize a terminal end of the cut-off part cut away at the previous step, and further, a relatively expensive image recognizing apparatus must be used for the above-mentioned recognition in order to overcome the above-mentioned problems. In particular, as to a resistance film such as a carbon paste, the color of the cut-off part is resembled to that of the resistance film, and accordingly, a distinction therebetween has hardly been able to be made.

SUMMARY OF THE INVENTION

The present invention has been devised in view of the above-mentioned problems inherent to prior art, and accordingly, an object of the present invention is to provide a resistance adjusting method, a resistance adjusting element and a resistance adjusting device which are capable of simply recognizing a terminal end of a cut-off part in such a case that a plurality of cut-off parts are formed in a resistance film and resistances thereof are adjusted.

According to the present invention, there is provided a resistance adjusting method, characterized by comprising a first cut-off step for obtaining a first cut-off part in a resistance film, a second cut-off step, subsequent to the first cut-off step, for obtaining a second cut-off part by cutting off the resistance film in a direction different from a direction in which the first cut-off step is carried out, so that the second cut-off part is continuous to the first cut-off part substantially at a position of one end of the first cut-off part so that the second cut-off part serves as a marker, and a third cut-off step for obtaining a third cut-off part by recognizing the position of the second cut-off part and cutting off the resistance film in a direction different from the direction in which the second cut-off part is carried out, so as to leave a part having a length capable of preventing cracking of the resistance film remained.

According to the present invention, there is provided a resistance adjusting element characterized by comprising a first cut-off part which extends from one widthwise end toward the other widthwise end of a resistance film, a second cut-off part which extends in a direction different from a direction of the first cut-off part so as to cross the first cut-off part substantially at a position of an end of the first cut-off part, and a third cut-off part which extends between the second cut-off part and the other widthwise end of the resistance film.

According to the present invention, there is provided a resistance adjusting device characterized by comprising a carrier portion on which a product provided with a resistance film is set; a laser irradiating portion for irradiating a laser beam onto the resistance film so as to form a cut-off part in a resistance film; a drive portion capable of causing a laser irradiating portion to scan in a plurality of axial directions; an image recognizing portion for recognizing a second cut-off part during preliminary resistance adjustment for both first cut-off part formed in the resistance film and the second cut-off part formed so as to cross the first cut-off part substantially at a position of an end part of the first cut-off part, and for inputting a position of the second cut-off part to a control portion; and a final resistance adjustment control portion for causing the drive portion to scan so as to form a third cut-off part in the resistance film, being based upon the position of the second cut-off part recognized by the image recognizing portion.

In view of the above-mentioned configuration according to the present invention, a terminal end of a cut-off part can be simply recognized when a plurality of cut-off parts are to be formed in a resistance film so as to adjust resistances.

Other objects, features and advantages of the invention will become apparent from the following description of the embodiments of the invention taken in conjunction with the accompanying drawings.

BRIEF DESCRIPTION OF SEVERAL VIEW OF THE DRAWING

DETAILED DESCRIPTION OF THE INVENTION

Figure 1:
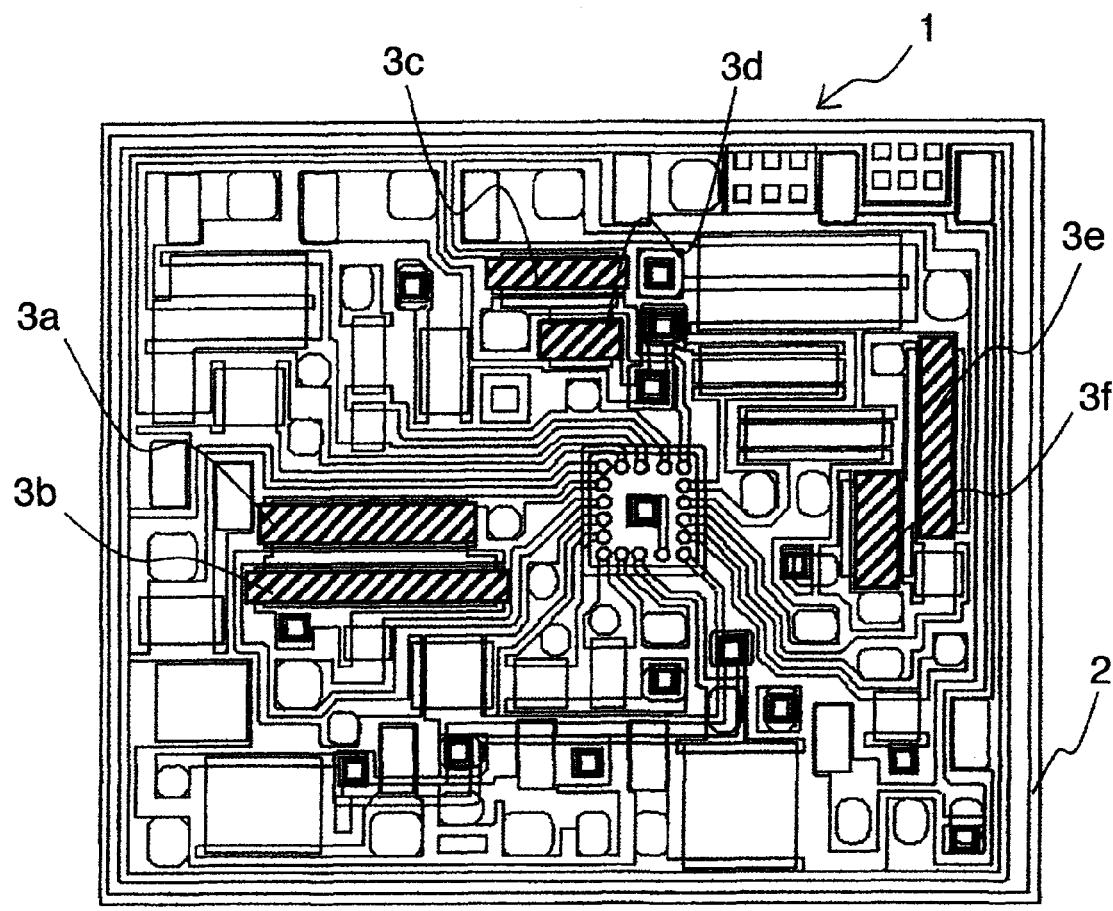
FIG. 1 is a top view illustrating an electronic circuit board.
Figure 2:
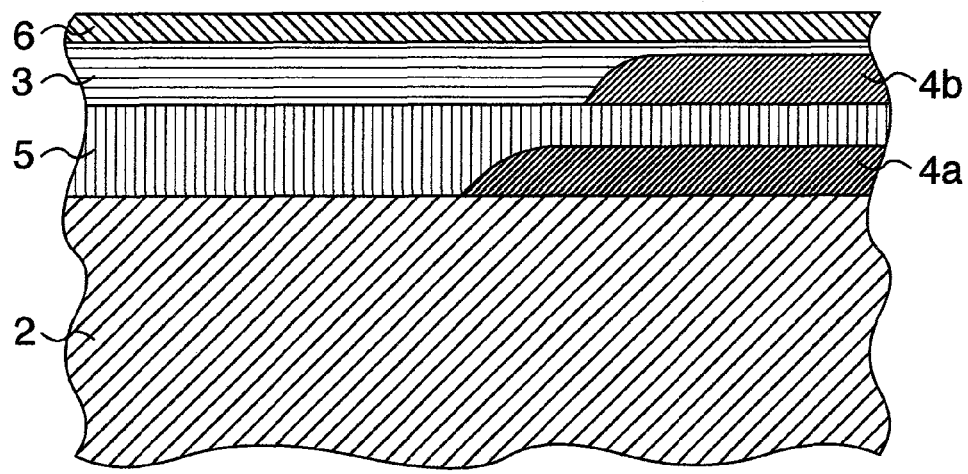
FIG. 2 is a side sectional view illustrating a resistance adjusting element part shown in FIG. 1.

Explanation will be hereinbelow made of an electronic circuit board on which a resistance adjusting element according to the invention is mounted, with reference to FIGS. 1 and 2, among which FIG. 1 is a top view illustrating an electronic circuit board for processing a signal from an air-flow sensor used in an engine of an automobile, and FIG. 2 is a side sectional view illustrating a resistance adjusting element part in FIG. 1.

The electronic circuit board 1 shown in FIG. 1 is adapted to be used in a signal process for amplifying a signal from an air-flow sensor and so forth, having, in particular, a relatively small size, that is, each side thereof has about 2 cm. The electronic circuit board is composed of a substrate 2 made of insulating material such as ceramic, various elements such as an operation amplifier and the like mounted on the substrate 2, conductors printed on the substrate 2, for connecting these elements to one another, and resistance film elements 3a to 3f serving as resistance adjustment elements, printed on the substrate, similar to the conductors, and spanning between the conductors.

Further, as shown in FIG. 2, a lower layer conductor 4a serving as a first layer is printed, direct on the substrate 2 of the electronic circuit board 1, and then, an insulating layer 5 is formed on the lower layer conductor 4a. Further, an upper layer conductor 4b serving as a second layer is printed on the insulating layer 5, and is then covered thereover with an overcoat glass layer 6. Thus, a multilayer circuit is obtained. The resistance film 3 is printed, spanning between different upper layer conductors 4b after the upper layer conductors 4b are printed on the insulating layer 5, and the overcoat glass layer 6 is then formed so as to cover both resistance film 3 and upper layer conductors 4b.

The resistance film 3 is formed so as to have a dried film thickness of 12 μm, that is, it is formed in such a way that a carbon paste is printed on the insulating layer 5 and the upper layer conductors 4b, is then calcined at a temperature of 860 degree C. The resistance film 3 is adapted to be cut-off in part by a laser beam in order to adjust a resistance value, as will be described later. However, should the power of the laser beam be excessive, not only the resistance film but also the insulating layer 5 would be cut. Even in view of such a case, it is devised that no lower layer conductor 4a is present underneath the resistance film 3 in parts where the film 3 is cut off, in order to prevent affection upon the lower layer conductor 4a.

Next, explanation will be made of the resistance film whose resistance has been adjusted, with reference to FIG. 3, which is an enlarged view illustrating a resistance film after its resistance is adjusted.

Figure 3:
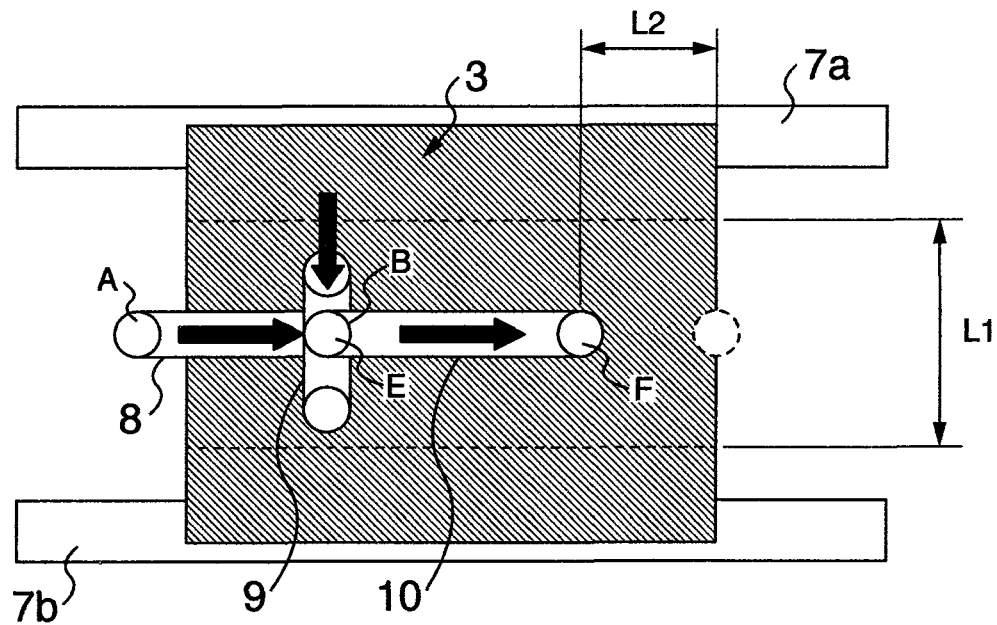
FIG. 3 is an enlarged view illustrating a resistance film after a resistance value is adjusted.

Referring to FIG. 3, conductors 7a, 7b which are formed so as to be linearly extended in the longitudinal direction, are laid being opposed to each other, and a substantially rectangular insulating film 3 is printed spanning between the conductors 7a, 7b. This resistance film 3 is laid so that the width in the direction in which the conductors 7a, 7b are opposed to each other, is greater than the width of the resistance film 3 spanning between the conductors. By cutting off the resistance film 3 with the laser beam in the widthwise direction in which the conductors 7a, 7b are opposed to each other, the sectional area of the resistance is changed so as to adjust the resistance value. It is noted that the cutting-off of the resistance film 3 is preferably made in parallel with the longitudinal direction in which the conductors 7a, 7b extend, as possible as it can, that is, it is necessary to cut off the resistance film within a zone having a width L1, in which no lower layer conductor 4a is laid, in order to eliminate any useless part.

The adjustment to the resistance value consists of a preliminary resistance adjustment for settling the resistance value within a certain range before the electronic circuit board 1 is mounted in the associated equipment, and a final resistance adjustment for setting the resistance value to a precise value after the electronic circuit board is mounted in the associated equipment. It is noted the cutting-off time is not so long since the cutting-off of the resistance film during the preliminary resistance adjustment can be made to be rough. Thus, due to the provision of the preliminary adjustment, it is possible to shorten the time for the final resistance adjustment.

The resistance film 3 is formed therein with a first cut-off part 8 by cutting off the resistance film 3 from a point A in FIG. 3, that is, a left end, as viewed in FIG. 3, in the width direction of the resistance film 3 in which the conductors are opposed to each other, toward the other end, so that the cut-off part is extended up to a position at which a resistance value is settled in a predetermined range. It is noted that the cut-off part 8 is extended from the point A to a point B as shown in FIG. 3.

Further, a second cut-off part 9 is formed being cut off so as to cross the first cut-off part 8, substantially orthogonal to the first cut-off part at the point B which is substantially at a position of an end part of the first cut-off part 8. The second cut-off part 9 is shorter than the first cut-off part 8, that is, it may be formed as a marker. Thus, the first cut-off part 8 and the second cut-off part 9 are formed in a substantial T-shape. Thus, even though the second cut-off part 9 is cut off in a direction substantially orthogonal to the direction of the width of the resistance film in which the conductors 7a, 7b are opposed to each other, the resistance value is not changed substantially. It is noted the preliminary resistance adjustment is carried out by cutting off the first cut-off part 8 and the second cut-off part 9.

Figure 4:
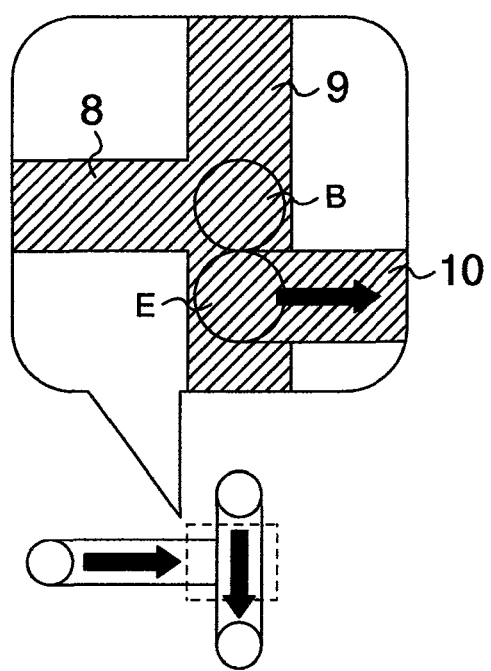
FIG. 4 is an enlarged view illustrating a resistance film in such a situation that a first cut-off part and a third cut-off part are shifted from each other through the intermediary of a second cut-off part.

Further, a third cut-off part 10 is cut off so as to be extended from the point B which is a cross point between the first cut-off part 8 and the second cut-off part 9 toward the right end part, as viewed in the drawing, in the width direction of the resistance film 3 in which the conductors 7a, 7b are opposed to each other, up to a position where the resistance value is desired to be finally adjusted. In FIG. 3, the third cut-off part 10 is extended from a point E to a point F so that it defines a substantially straight light continuous from the first cut-off part 8 since the third cut-off part 9 is cut off in the same direction as that of the first cut-off part 8. It is noted that a length L2 capable of preventing cracking has to be left in the range from the point E of the third cut-off part 10 up to the right end part, as viewed in the drawing, of the width of the resistance film in which the conductors 7a, 7b are opposed to each other. Incidentally, the final resistance adjustment is carried out by cutting off the third cut-off part 10. Further, as shown in FIG. 4, the first cut-off part 8 and the third cut-off part 10 may be shifted from each other through the intermediary of the second cut-off part 8, in the direction in which the second cut-off part 9 is extended.

Next, explanation will be hereinbelow made of a method of adjusting a resistance with reference to FIGS. 5A to 5F, which show cut-off parts at respective cutting-off steps.

Figure 5A:
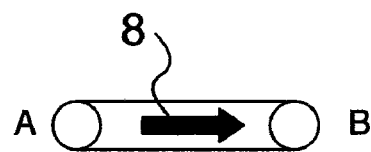
FIGS. 5A to 5E are views illustrating cut-off parts at respective cutting-off steps.
Figure 5B:
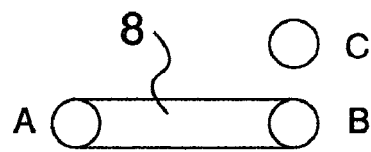
Figure 5C:
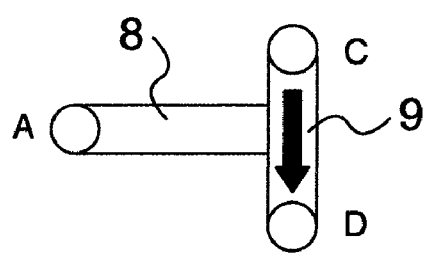
Figure 5D:
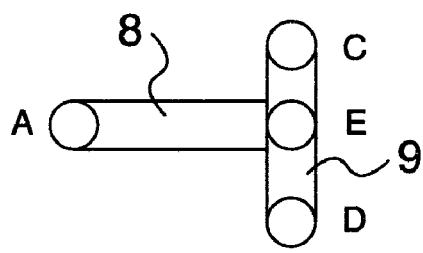
Figure 5E:
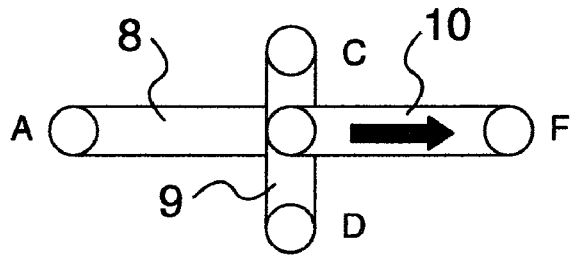

FIG. 5A shows a first cutting-off step, FIGS. 5B and 5C show a second cutting-off step at a start and an end thereof, respectively. The first and the second steps are adapted for the preliminary resistance adjustment which is to be carried out for the electronic circuit board 1 itself before it is incorporated in the associated equipment, that is, a laser beam is irradiated onto the resistance film 3 located on the electronic circuit board 1 in order to form a cut-off part. Further, FIGS. 5D and 5E show a third cutting-off step at a start and an end thereof, respectively, for the final resistance adjustment which is carried out for setting the resistance value to a precise value after the electronic circuit board 1 is incorporated in the associated equipment. Similarly to the first and second cutting-off steps, a laser beam is irradiated onto the resistance film 3 so as to form a cut-off part.

The cutting-off by the laser beam is carried out in such a way that an Nd-YAG laser beam having an oscillation wavelength of 1,064 µm is converged into a spot beam having a diameter of 50 µm, and is then moved at a speed of 40 mm/sec with a pulse rate of 3 kHz, by means of a galvanometer type optical scanner.

For the preliminary resistance adjustment, the laser beam is swung for scanning while the electronic circuit board 1 is fixed, and the cutting is made while scanned positions by the laser beam are recognized as coordinates. As shown in FIG. 5A, at the first cutting-off step, the laser beam is swung for scanning on the resistance film 3 from a point A located outside of the resistance film in the width direction in which the conductors 7a, 7b are opposed to each other, to a point B at which the resistance value falls into a predetermined resistance range, along the width direction of the resistance film in which the conductors 7a, 7b are opposed to each other. The coordinates of the point B which is a final point of the first cut-off part 8 that is thus scanned at the first cutting-off step are stored in memory, and further, the electronic circuit board 1 is maintained in a fixed condition.

Next, the second cutting-off step is carried out in such a way that the second cut-off part 9 is formed so as to cross the first cut-off part 8 at the point B in such a condition that the electronic circuit board 1 is held to be fixed. Since the coordinates of the point B of the first cut-off part 8 are stored in memory, the cutting-off step of the second cut-off part 9 can be made being started from a point C as shown in FIG. 5B, up to a point D after it surely crosses the first cut-off part 8 at the point B, as shown in FIG. 5C. In view of cracking of the resistance film 3, it is desirable to set the point B which is the cross point between the first cut-off part 8 and the second cut-off part 9 at a substantially middle point of the second cut-off part 9.

It is noted, in the case of the provision of a plurality of resistance films 3a, 3b, 3c, 3d, 3e, 3f on the electronic circuit board 1, that the first cutting-off step and the second cutting-off step are successively curried out for each resistance film 3. When the preliminary resistance adjustment for setting the resistance value of the electronic circuit board 1 in a predetermined range is completed as such, the electronic circuit board 1 is released from its fixed condition, and is then incorporated in a housing member constituting the outer shell of an air-flow sensor or the like.

Next, the electronic circuit board 1 incorporated in the associated equipment such as an air-flow sensor is subjected to the third cutting-off step for the final resistance adjustment while a value of an actual output power therefrom is observed. At this third cutting-off step, the cross point B between the first cut-off part 8 and the second cut-off part 9 is recognized by an image recognizing device such as a CCD camera. For example, should no second cut-off part 9 be present, that is, should only the first cut-off part 8 be formed, a detection system using high bright illumination and a CCD camera having a large number of pixels would be necessary for detecting the terminal end of the first cut-off part 8 which corresponds to the terminal point B. However, in this embodiment, the second cut-off part 9 is formed, orthogonal to the terminal end of the first cut-off part 8 which corresponds to the cross point B, and accordingly, the position of the cross point between the first cut-off part 8 and the second cut-off part 9 can be easily recognized according to lighting adjustment. Thus, even a relatively inexpensive CCD camera having about 330,000 pixels can detect the cross point B.

As shown in FIG. 5D, after the cross point B between the first cut-off part 8 and the second cut-off part 9 is recognized, a third cut-off part 10 is formed by cutting the resistance film 3 in a direction toward the right side end thereof, as viewed in FIG. 3, which is different from the cutting-off direction of the second cut-off part 9, from a point E which overlaps with the point B. At this time, as shown in FIG. 5E, the third cut-off part 10 is formed in view of an output power value of the electronic circuit board 1 and a distance to the right side end of the resistance film 3 as viewed in FIG. 3. Thus, such a length L2 as to prevent the resistance film 3 from being cracked can be left between the terminal end of the third cut-off part 10 which corresponds to a point F and the right side end of the resistance film 3 as viewed in FIG. 3.

Incidentally, for the provision of the length L2 capable of preventing cracking of the resistance film 3, the terminal end which corresponds to the point F of the third cut-off part 10 and the end part of the resistance film 3 are recognized by the CCD camera, and the laser beam is swung for scanning in order to prevent the distance therebetween from being less than a predetermined value. At this time, for example, if the output of the resistance value has not yet adjusted precisely even though the distance between the terminal end of the third cut-off part 10 and the end part of the resistance film 3 becomes less than a predetermined value, it is determined that the electron circuit board 1 is defective, and accordingly, the resistance adjustment is ceased.

Further, even though the cross point B between the first cut-off part 8 and the second cut-off part 9 is recognized by the CCD camera, it is difficult to cut-off the third cut-off part 10 from the same position as that of the cross point B. Thus, as shown in FIG. 4, even though the start point E of the third cut-off part 10 is spaced more or less from the point B, the third cut-off part 10 is formed in such a way that it can be connected with the second cut-off part 9, and accordingly, it is possible to eliminate such a problem that the cut-off parts which have not yet been connected with each other, are connected due to clacking of the resistance film 3 in future, resulting in variation in resistance.

Figure 6:
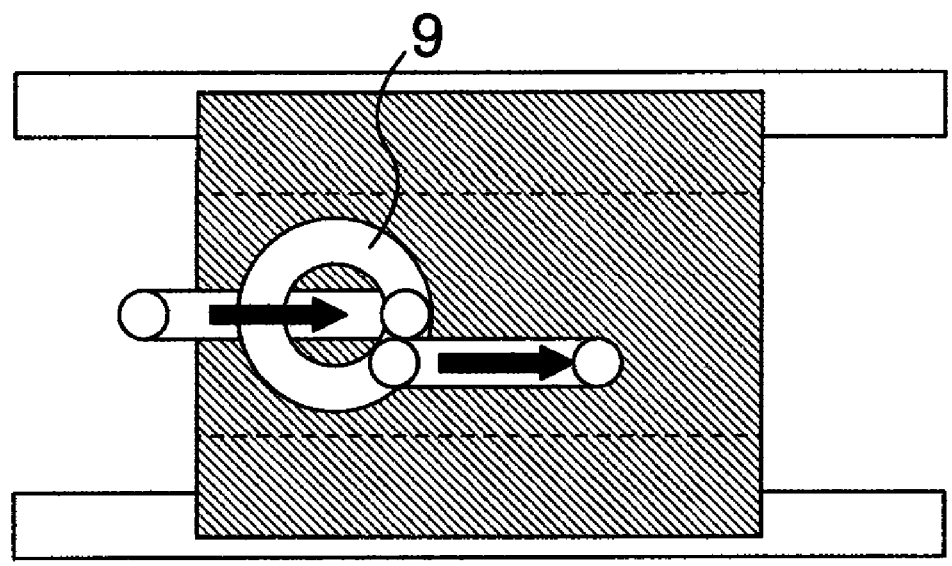
FIG. 6 is a view illustrating the second cut-off part having a circular shape.

It is noted that the second cut-off part 9 may be circular as shown in FIG. 6 although it is straight in this embodiment. The circular second cut-off part 9 enables the position of the second cut-off part 9 to be easily recognized by the CCD camera, thereby it is possible to further reduce the number of pixels of the CCD camera.

Figure 7:
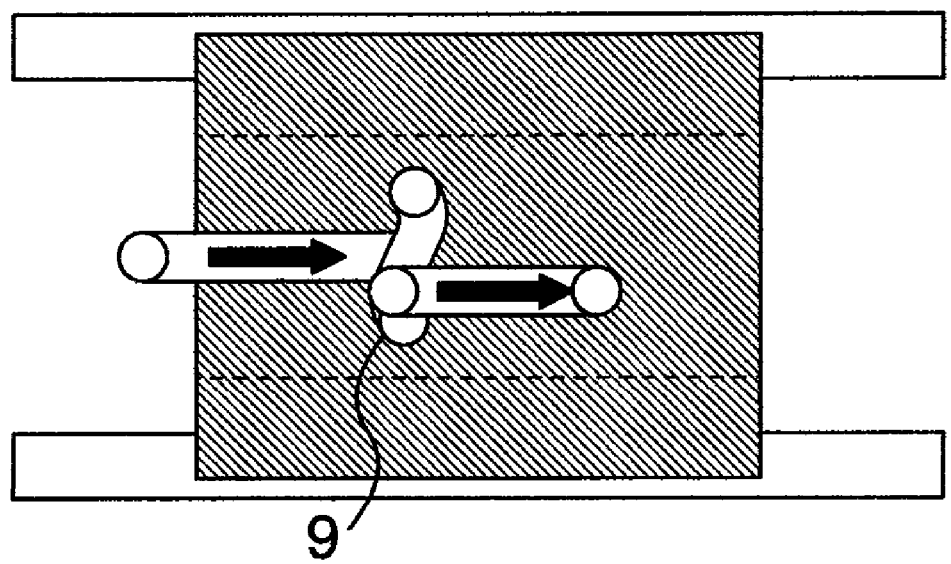
FIG. 7 is a view illustrating the second cut-off part having a curved shape.

In addition, the second cut-off part 9 may be formed in a curved shape as shown in FIG. 7. In this way, it is possible to form the second cut-off part 9 in a curved shape. The second cut-off part 9 shown in FIG. 7 is formed in a waveform shape. The curved second cut-off part 9 allows for easy recognition by the CCD camera, as in the case of the circular second cut-off part.

Next, explanation will be made of a resistance adjusting device with reference to FIG. 8, which is a perspective view illustrating a resistance adjusting device for carrying out resistance adjustment.

Figure 8:
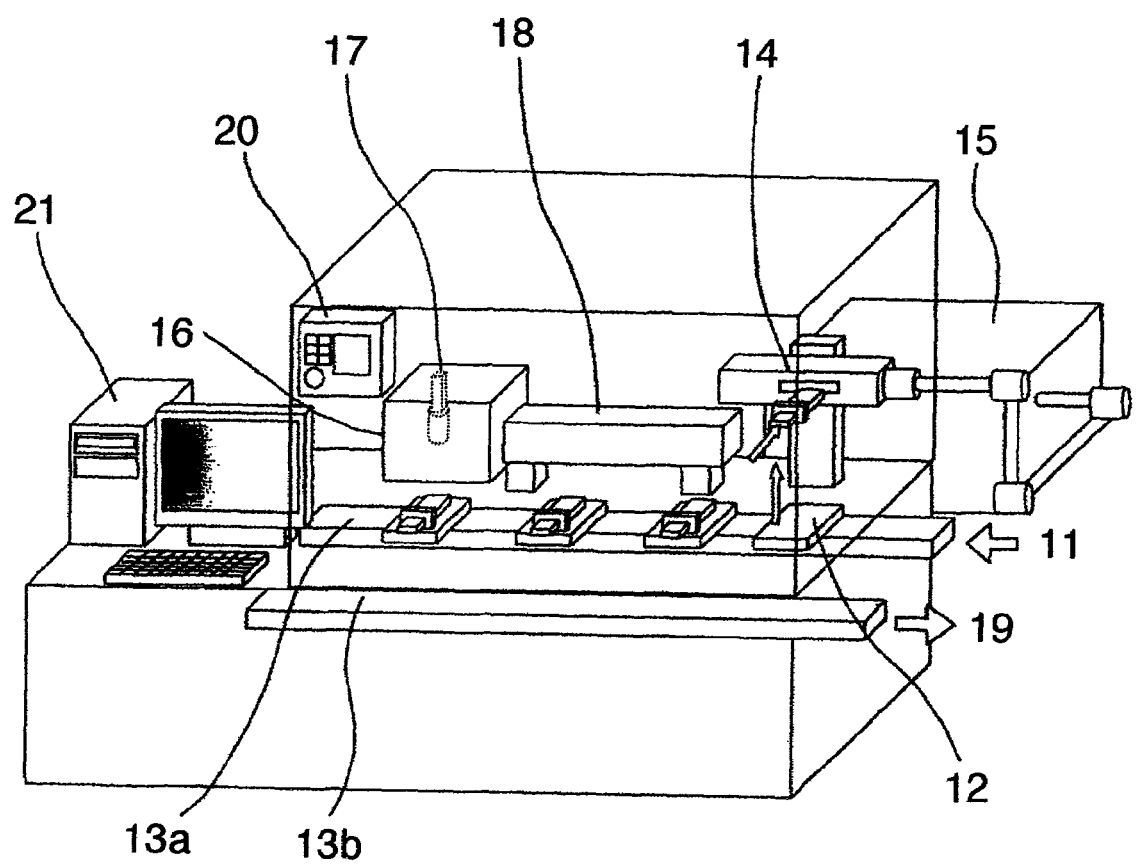
FIG. 8 is a perspective view illustrating a resistance adjusting device for carrying out final resistance adjustment.

The resistance adjusting device shown in FIG. 8 is adapted to carry out the final resistance adjustment. In the case of mounting an air flow sensor as a product on this resistance adjusting device, the preliminary resistance adjustment has been already completed for the electronic circuit board 1 itself with the use of an additional preliminary resistance adjusting device. The preliminary resistance adjusting device for carrying out the preliminary resistance adjustment, which is basically similar to the final resistance adjusting device as shown in FIG. 8, comprises a laser irradiation aperture for irradiating a laser beam, and a drive portion for swinging the laser irradiation aperture for scanning, and is adapted to take up a position of the end part of the first cut-off part in the form of coordinates. The second cut-off part 9 may be formed while the position of the end part of the first cut-off part 8 is confirmed actually by a displacement sensor. However, even though the displacement sensor is not present, by taking up the motion of the drive portion in the form of coordinates, the coordinates of the first cut-off part 8 can be stored in memory. It is noted that since the electronic circuit board 1 is held at the same position until the second cut-off part 9 is formed after the formation of the first cut-off part 8, the coordinates of the end part of the first cut-off part 8 are never deviated.

Thus, the electronic circuit board 1 for which the preliminary resistance adjustment has been completed, is attached to a housing which is the outer shell of the air-flow sensor as a product, and thereafter, the final resistance adjustment is carried out therefor with the use of the resistance adjusting device which is shown in FIG. 8. This resistance adjusting device is composed of a carrier bed 12 on which the air-flow sensor before the final adjustment is set and which serves as a carrier part in a product introduction portion 11, and a moving means 13a such as a conveyer whose displacement value is automatically controlled, for automatically conveying the air-flow sensor in the direction of the arrow (from the right to the left side in FIG. 8).

When the air-flow sensor is moved up to a position in front of an initial characteristic measuring portion 14 by the moving means 13a, the air-flow sensor is automatically lifted up onto the initial characteristic measuring portion 14 by means of a mechanical member such as an arm (which is not shown). Thereafter, a vacuum pressure is effected in the initial characteristic measuring portion 14 by means a vacuum generating unit 15, and then, an air flow rate is measured by the air-flow sensor in order to obtain a detection error. The thus obtained detection error is stored in a final resistance adjustment control portion which is not shown and which is installed in the resistance adjusting device. Thus, the air-flow sensor for which an initial characteristic is measured by the initial characteristic measuring portion 14 is returned to the original carrier bed 12, and is then moved to a laser irradiating portion 16 by means of the moving means 13a.

The laser irradiating portion 16 is constituted so as to carry out scanning in both X-axial direction and Y-axial direction by a drive portion incorporated in the laser irradiating portion 16, and a CCD camera 17 serving as an image recognizing portion is mounted on one side of the laser irradiating portion 16. This CCD camera 17 is located at a position distance from the laser irradiating portion 16 so as to prevent affection by the laser beam, and is adapted to recognize an image which is reflected by a mirror.

When the air-flow sensor is moved to a position in front of the laser irradiating portion 16 by means of the moving means 13a, the position of the cross-point B between the first cut-off part 8 and the second cut-off part 9 is recognized by the CCD camera 17. Further, the length of the third cut-off part 10 is calculated from a detection error which has been stored in the final resistance adjustment control portion and which is obtained from the initial characteristic. In dependence upon of these data, the laser irradiating portion 16 is swung for scanning by the drive portion, while a laser is excited by a laser energizing portion 18 provided adjacent to the laser irradiating portion 16 in order to irradiate a laser beam so as to form the third cut-off part 10. It is noted that the CCD camera 17 also recognizes an edge part corresponding to the end part of the resistance film 3, and accordingly, the final resistance adjustment control portion sets the length between the edge part of the resistance film 3 and the third cut-off part 10 to be larger than a predetermined value with which the resistance film 3 can be prevented from cracking. Thus, the third cut-off part 10 is cut off by a length which has been obtained from the initial characteristic. If the length between the edge part of the resistance film 3 and the third cut-off part 10 (the point F) is not greater than the predetermined value with which the resistance film is prevented from cracking, it is determined that the air-flow sensor is defective, and accordingly, the resistance adjustment is ceased.

The air-flow sensor for which the final resistance adjustment has been completed, is shifted into a product discharge portion 19 by means of a mechanical member such as an arm (which is not shown), then is automatically moved in the direction of the arrow (from the left side to the right side in FIG. 8) by a moving means 13b such as a conveyer. That is, the air-flow sensor can be finally delivered as a finished product. The final resistance adjustment is carried out through a series of steps as stated above. It is noted that a plurality of air-flow sensors can be set up on the product introduction portion 11 and the product discharge portion 19, and accordingly, the resistance adjustment can be carried out for a plurality of air-flow sensors, successively.

Further, the resistance adjustment device can be controlled through a control panel 20, and the measurement for a resistance value and the control of the laser coordinate axes can be carried out by an equipped computer 21.

Next, explanation will be hereinbelow made of technical effects and advantages of the above-mentioned embodiments.

In the method of adjusting a resistance in the above-mentioned embodiment, the second cut-off part serving as a marker is formed in a direction different from the cutting-off direction of the first cut-off part, in connection with the first cut-off part at a position substantially at the end part of the latter, and accordingly, the position of the cross point between the first cut-off part and the second cut-off part can be readily recognized according to a lighting adjustment. Thus, it is possible to use a relatively inexpensive device without a risk of instability of a resistance value which is caused by cracking of the resistance film.

Further, in the method of adjusting a resistance in the above-mentioned embodiment, since the third cut-off part is cut off from the second cut-off part toward the end part of the resistance film, the second cut-off part and the third cut-off part are connected to each other with no gap therebetween, thereby it is possible to prevent the resistance value from being changed due to cracking of a remaining part therebetween.

Further, in the method of adjusting a resistance in the above-mentioned embodiment, the position of the first cut-off part is stored in memory, and the second cutting-off step is carried out in accordance with the stored position, thereby it is possible to surely connect the second cut-off part to the first cut-off part substantially at the position of the end part of the latter.

Further, in the method of adjusting a resistance in the above-mentioned embodiment, the resistance film is cut while coordinate data is held in the computer until the second cut-off part is formed after the formation of the first cut-off part, it is possible to correct the coordinates at any time even though the electronic circuit board is slipped during the cutting of the resistance film.

Further, in a method of cutting off the resistance film in this embodiment, a laser process or a sand blast process may be used. With the use of these processes, an extremely thin cut-off part can be formed in the resistance film, and accordingly very fine resistance adjustment can be made.

Further, the resistance adjusting element in the above-mentioned embodiment, is composed of a first cut-off part which extends in the resistance film from one end and to the other end in the width direction in which the conductors are opposed to each other, and a second cut-off part which extends in a direction different from the cutting-off direction of the first cut-off part so as to cross the first cut-off part substantially at the position of the end part of the first cut-off part, and accordingly, the position of the cross point between the first cut-off part and the second cut-off part can be readily recognized according to a lighting adjustment, thereby it is possible to use a relatively inexpensive device for carrying out resistance adjustment. Further, the third cut-off part is formed, leaving a part having a predetermined width remained between the second cut-off part and the other widthwise end part of the resistance film, thereby it is possible to prevent the resistance from being unstable due to cracking of the resistance film.

Further, the third cut-off part in the resistance adjusting element in the above-mentioned embodiment extends in the resistance film from the second cut-off part toward the other end in the width direction of the resistance film in which the conductors are opposed to each other, and accordingly, the second cut-off part and the third cut-off part are connected to each other with no gap being remained therebetween, thereby it is possible to prevent the resistance from being changed due to clacking of the remaining part.

Further, in the above-mentioned embodiment, the second cut-off part in the resistance film is cut off in a direction substantially orthogonal to the width direction of the resistance film in which the conductors are opposed to each other. Alternatively, the first cut-off part and the second cut-off part are formed in a T-shape so that the second cut-off part is connected to the end part of the first cut-off part, and accordingly, no acute angle part is formed in the resistance film. Thus, variation in resistance due to cracking of the resistance film can be reduced as possible as it can, and accordingly, variation in resistance caused by the formation of the second cut-off part serving as a marker can be reduced as possible as it can.

Further, the first cut-off part and the third cut-off part in the resistance adjustment element in the above-mentioned embodiment, are formed substantially in the same direction which is the width direction of the resistance film in which the conductors are opposed to each other, and accordingly, no acute angle part is formed in the resistance film 3. Thus, variation in resistance caused due to cracking of the resistance film can be reduced as possible as it can.

Further, in the above-mentioned embodiment, the first cut-off part and the third cut-off part in the resistance adjustment element, may be connected through the intermediary of the second cut-off part, being shifted from each other in the direction in which the second cut-off part extends, and accordingly, even though the first cut-off part and the third cut-off part are shifted from each other, they can be communicated with each other through the intermediary of the second cut-off part. Thus, even no small gap is formed in the resistance film, thereby it is possible to prevent variation in resistance caused by cracking.

Further, in the above-mentioned embodiment, the first cut-off part and the third cut-off part in the resistance adjusting element are connected to each other by way of the second cut-off part so as to define a straight line, and accordingly, the resistance adjustment can be made in a narrow range.

Further, in the above-mentioned embodiment, the second cut-off part in the resistance adjusting element is shorter than the first cut-off part, and therefore, the cracking can be prevented as possible as it can. In addition, the use of a laser beam or the like can be minimized.

Further, in the above-mentioned embodiment, the second cut-off part in the resistance adjusting element is cut off in a circular or curved shape, thereby it is possible to readily recognize the position of the second cut-off part.

Further, the resistance adjusting device in the above-mentioned embodiment is composed the image recognizing portion for recognizing the second cut-off part in the preliminary resistance adjustment including the formation of the first cut-off part formed in the resistance film and the second cut-off part which crosses the first cut-off part substantially at the position of the end part of the latter, and further, the third cut-off part is formed in the resistance film, being based upon the position of the second cut-off part recognized by the image recognizing portion and a measured initial characteristic, and accordingly, the resistance adjustment can be made in a relatively inexpensive manner. Further, it is possible to cut off the third cut-off part substantially from the position of the end part of the first cut-off part.

The resistance adjustment device in the above-mentioned embodiment carries out such control that the distance between the third cut-off part and the end part of the resistance film is prevented from being not less than a predetermined value, and accordingly, it is possible to prevent occurrence of such a problem that the resistance film is cracked so as to cause no current running.

It is noted that the present invention can be applied to any of electronic circuit boards having a use purpose similar to the above-mentioned embodiment although explanation has been made of the electronic circuit board used in an air-flow sensor in the above-mentioned embodiment.

Further, in the above-mentioned embodiment, although the second cut-off part and the third cut-off part are connected to each other, the second cut-off part and the third cut-off part may not be connected to each other if the space between the second cut-off part and the third cut-off part which can prevent the resistance film from cracking can be left in the resistance film.

Further, in the above-mentioned embodiment, the third cut-off part may be formed in a direction different from the direction of the first cut-off part although the first cut-off part and the third cut-off part are formed in the same direction in the above-mentioned embodiment. Further, it is not necessary to cross the first cut-off part and the second cut-off part, orthogonal to each other, that is, the second cut-off part may be inclined to a line perpendicular to the first cut-off part.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A method of resistance adjustment by cutting off a resistance film formed spanning between a plurality conductors on an electronic circuit board so as to adjust a resistance value between the conductors, wherein the resistance adjustment has a preliminary resistance adjustment which is carried out before said electronic circuit board is incorporated in an associated equipment, and a final resistance adjustment which is carried out after said electronic circuit board is incorporated in the associated equipment, said preliminary resistance adjustment comprising a first cutting-off step of cutting off the resistance film so as to form a first cut-off part, and a second cutting-off step carried out subsequent to the first cutting-off step, of cutting off the resistance film in a direction different from a cutting-off direction of the first cut-off part so as to form a second cut-off part which is connected to the first cut-off part substantially at a position of an end part of the first cut-off part and which serves as a marker, and said final resistance adjustment comprising a third cutting-off step of recognizing a position of said second cut-off part, and cutting off the resistance film in a direction different from the cutting-off direction of the second cut-off part so as to form a third cut-off part, leaving a length capable of preventing cracking of said resistance film remained.

2. The resistance adjustment method as set forth in claim 1, wherein said third cut-off part is cut off from said second cut-off part toward an end part of said resistance film.

3. The resistance adjustment method as set forth in claim 1, wherein after said first cutting step is completed, said position of the end part of said first cut-off part is stored in memory, and said second cutting step is carried out in accordance with said stored position.

4. The resistance adjustment method as set forth in claim 1, wherein said preliminary resistance adjustment can be carried out by a device which is different from a device for said final resistance adjustment, and said resistance film is cut off while coordinates are held as data until said second cut-off part is formed after said first cut-off part is formed.

5. The resistance adjustment method as set forth in claim 1, wherein said first to third cut-off parts are formed by cutting off said resistance film with use of a laser process.

6. The resistance adjustment method as set forth in claim 1, wherein said first to third cut-off parts are formed by cutting off said resistance film with use of a sand blast process.

7. A resistance adjusting element comprising a resistance film provided spanning between conductors which are opposed to each other on an electronic circuit board,
wherein said resistance film is formed therein with:
a first cut-off part which extends in said resistance film from one end in a width direction of said resistance film in which said conductors are opposed to each other, toward the other end thereof,
a second cut-off part which extends in a direction different from said first cut-off part so as to cross said first cut-off part substantially at a position of an end part of said first cut-off part, and
a third cut-off part which extends between said second cut-off part and the other end in said width direction of the resistance film, leaving a predetermined width remained in said resistance film.

8. The resistance adjusting element as set forth in claim 7, wherein said third cut-off part extends from said second cut-off part toward the other end in the width direction of said resistance film in which said conductors are opposed to each other.

9. The resistance adjusting element as set forth in claim 7, wherein said second cut-off part is cut off in a direction, substantially orthogonal to said width direction of said resistance film in which said conductors are opposed to each other.

10. The resistance adjusting element as set forth in claim 9, wherein said first cut-off part and said second cut-off part are formed substantially in a T-shape so as to connect said second cut-off part to said end part of said first cut-off part.

11. The resistance adjusting element as set forth in claim 7, wherein said first cut-off part and said third cut-off part are formed substantially in the same direction which is said width direction of said resistance film in which said conductors are opposed to each other.

12. The resistance adjusting element as set forth in claim 7, wherein said first cut-off part and said third cut-off part are connected to each other through an intermediary of said second cut-off part, being shifted from each other in a direction in which said second cut-off part extends.

13. The resistance adjusting element as set forth in claim 7, wherein said first cut-off part and said third cut-off part are connected to each other through an intermediary of said second cut-off part so as to define a continuous straight line.

14. The resistance adjusting element as set forth in claim 7, wherein said second cut-off part is shorter than said first cut-off part.

15. The resistance adjusting element as set forth in claim 7, wherein said resistance film is formed of a carbon paste.

16. The resistance adjusting element as set forth in claim 7, wherein said second cut-off part is cut off in a circular shape.

17. The resistance adjusting element as set forth in claim 7, wherein said second cut-off part is cut off in a curved-like shape.

18. A resistance adjusting device for resistance adjustment by cutting off a resistance film formed on an electronic circuit board adapted to be incorporated in an associated equipment, with use of a laser beam, said resistance adjusting device comprising:
a carrier portion on which a product provided with a resistance film is set up,
an initial characteristic measuring portion for measuring an initial characteristic of said product,
a laser irradiating portion for irradiating a laser beam onto said resistance film so as to form a cut-off part,
a drive portion for causing said laser irradiating portion to carry out scanning in a plurality of axial directions,
an image recognizing portion for recognizing a second cut-off part during preliminary resistance adjustment including formation of a first cut-off part in said resistance film and of said second cut-off part formed in said resistance film so as to cross said first cut-off part substantially at a position of an end part of said first cut-off part,
a final resistance adjustment control portion for causing said drive portion so as to carry out scanning, in order to form a third cut-off part in said resistance film in accordance with a position of said second cut-off part recognized by said image recognizing portion and said initial characteristic measured by said initial characteristic measuring portion.

19. The resistance adjusting device as set forth in claim 18, wherein said final resistance adjustment control portion causes said drive portion to carry out scanning so as to cut off said third cut-off part substantially from said position of the end part of said first cut-off part.

20. The resistance adjusting device as set forth in claim 18, wherein said final resistance adjustment control portion controls said drive portion so as to prevent a width between said third cut-off part and said end part of said resistance film from becoming not less than a predetermined value.

* * * * *